United States Patent
Peitz (10) Patent No.: US 11,552,072 B2
(45) Date of Patent: Jan. 10, 2023

(54) ELECTRONIC DISCHARGE DEVICE AND SPLIT MULTI RAIL NETWORK WITH SYMMETRICAL LAYOUT DESIGN TECHNIQUE

(71) Applicant: Dialog Semiconductor (UK) Limited, London (GB)

(72) Inventor: Marcus Peitz, Planegg (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 17/350,044

(22) Filed: Jun. 17, 2021

(65) Prior Publication Data
US 2021/0313315 A1    Oct. 7, 2021

Related U.S. Application Data

(62) Division of application No. 15/344,617, filed on Nov. 7, 2016, now Pat. No. 11,088,134.

(51) Int. Cl.
*H01L 27/02* (2006.01)
*H01L 23/528* (2006.01)
*H01L 23/60* (2006.01)

(52) U.S. Cl.
CPC ...... *H01L 27/0292* (2013.01); *H01L 27/0296* (2013.01); *H01L 23/5286* (2013.01); *H01L 23/60* (2013.01); *H01L 2224/0401* (2013.01); *H01L 2224/05548* (2013.01)

(58) Field of Classification Search
CPC . H01L 23/60; H01L 23/5286; H01L 27/0296; H01L 27/0292; H01L 2224/0401; H01L 2224/05548

USPC ....................................................... 361/220
See application file for complete search history.

(56) References Cited

U.S. PATENT DOCUMENTS

| 7,250,659 | B2 | 7/2007 | Troost |
| 11,088,134 | B2 | 8/2021 | Peitz |
| 2001/0024348 | A1 | 9/2001 | May et al. |
| 2003/0112565 | A1 | 6/2003 | He et al. |

(Continued)

OTHER PUBLICATIONS

U.S. Notice of Allowance, U.S. Appl. No. 15/344,617, Applicant: Marcus Peitz, dated Apr. 16, 2021, 9 pages.

(Continued)

*Primary Examiner* — Kevin J Comber
(74) *Attorney, Agent, or Firm* — Saile Ackerman LLC; Stephen B. Ackerman (57) ABSTRACT

A symmetrical layout technique for an electrostatic discharge ESD device and a corresponding power supply network is presented. The ESD device protects an electronic circuit against an overvoltage or overcurrent and contains a first contact area to establish an electrical contact with a first supply rail, a second contact area to establish an electrical contact with a second supply rail, and a third contact area to establish an electrical contact with a third supply rail. The first and third supply rails provide a first supply voltage, and the second supply rail provides a second supply voltage. Within the ESD device, an axis of symmetry passes through the second contact area, and the first contact area and the third contact area are arranged on opposite sides with regard to the axis of symmetry. The symmetrical layout technique allows flipping the orientation of the ESD device with regard to the supply rails.

9 Claims, 6 Drawing Sheets

(56) References Cited

U.S. PATENT DOCUMENTS

| | | |
|---|---|---|
| 2004/0217425 A1 | 11/2004 | Brodsky et al. |
| 2006/0125015 A1 | 6/2006 | Woo |
| 2006/0203405 A1 | 9/2006 | Bhattacharya et al. |
| 2007/0008667 A1 | 1/2007 | Steinhoff |
| 2009/0052101 A1 | 2/2009 | Mrcarica et al. |
| 2010/0188788 A1* | 7/2010 | Padden ............... H01L 27/0251 |
| | | 361/56 |
| 2014/0036397 A1 | 2/2014 | Yang |
| 2015/0249334 A1 | 9/2015 | Chen et al. |

OTHER PUBLICATIONS

U.S. Office Action, U.S. Appl. No. 15/344,617, Applicant: Marcus Peitz, dated Jul. 19, 2019, 20 pages.

\* cited by examiner

ELECTRONIC DISCHARGE DEVICE AND SPLIT MULTI RAIL NETWORK WITH SYMMETRICAL LAYOUT DESIGN TECHNIQUE

This is a Divisional application of U.S. patent application Ser. No. 15/344,617, filed on Nov. 7, 2016, which is herein incorporated by reference in its entirety, and assigned to a common assignee.

TECHNICAL FIELD

The present document relates to integrated circuits with electrostatic discharge ESD protection. More specifically, the document relates to ESD devices and corresponding layouts of a power supply network for protecting internal circuit devices against overvoltages and overcurrents.

BACKGROUND

Typically, an ESD clamp circuit is coupled between two power supply rails such as e.g. power and ground and is used to protect internal circuit devices of an integrated circuit from voltage overstress. The internal circuit devices are also powered via the power supply rails and are accessible via I/O pads. Specifically, each internal circuit device may be accessible via a first I/O pad for inputting data signals and via a second I/O pad for outputting data signals. For integrated circuits with a plurality of internal circuit devices, each internal circuit device may be protected by at least one ESD clamp circuit. During an ESD strike, overcurrents and/or overvoltages may occur at the I/O pads, and corresponding discharge currents need to be discharged via the ESD clamp circuits to prevent the internal circuit devices from being damaged.

At this, the resistance of a discharge path from a first I/O pad to a second I/O pad is an important design parameter. Such a discharge path typically includes one or more ESD clamp circuits and corresponding electrical connections between the ESD clamp circuits and the I/O pads. In particular, the resistance of the discharge path should be chosen as low as possible to avoid damaging the internal circuit device. In other words, a small resistance of the discharge path is desirable to avoid a discharge current through the internal circuit device which is protected by the corresponding ESD clamp circuit(s). To this end, all ESD clamp circuits are usually connected to the two power supply rails and form parallel discharge paths in case of ESD strike events.

Moreover, as the number of internal circuit devices to be protected increases, the routing of electrical connections from the ESD clamp circuits to the respective I/O pads becomes more complicated. For example, routing design becomes challenging when the number of I/O pads exceeds e.g. 400. When designing the electrical connections through the different layers of the integrated circuit, different constraints need to be taken into account. Such constraints include e.g. minimal pitches between the electrical connections, the I/O pads, and the ESD clamp circuits. Moreover, the routing is further constrained by the orientation of the ESD clamp circuits with regard to the power supply rails, and, finally, by the design of the power supply rails themselves.

SUMMARY

When designing a layout of the ESD clamp circuits and corresponding electrical connections to the I/O pads, it is an objective to reduce the resistance of the overall discharge paths, wherein the overall discharge paths also include the resistances of the electrical connections (i.e. their lengths) from the I/O pads to the ESD clamp circuits. Further objectives include but are not limited to optimizing the usage of the available area of the integrated circuit, minimizing the required area of the ESD protection network or simplifying the layout design of the ESD protection network. The present document addresses the above mentioned technical problems. An electrostatic discharge ESD device for protecting an electronic circuit (internal circuit device) against an overvoltage or an overcurrent comprises a first contact area, a second contact area, and a third contact area. The first contact area is configured to establish an electrical contact with a first supply rail. The second contact area is configured to establish an electrical contact with a second supply rail, whereas the third contact area is configured to establish an electrical contact with a third supply rail. An axis of symmetry passes through the second contact area. The first contact area and the third contact area are arranged on opposite sides with regard to the axis of symmetry.

During times in which no overcurrents or overvoltages occur, the electronic circuit to be protected by the ESD device may be powered by the first, the second and the third supply rail. For this purpose the electronic circuit may be coupled between the first or the third supply rail on the one hand and the second supply rail on the other hand. As will be discussed in more detail below, both the first and the third supply rail may provide a first supply voltage (e.g. VDD or VSS) to the electronic circuit, and the second supply rail may provide a second supply voltage (e.g. VSS or VDD, respectively) to the electronic circuit.

The electronic circuit may form part of an overall integrated circuit and may be any kind of analog or digital electronic component such as e.g. a level shifter, a power converter or an analog-to-digital converter. For example, the electronic circuit may be a device whose functionality is made available to other components of the integrated circuit via the I/O pads. In general, the overall integrated circuit may be implemented using any kind of suitable packaging technology (e.g. a wafer-level chip-scale package WLCSP or flip chip chip-scale package FCCSP).

The contact areas may comprise any kind of conducting material and may have an arbitrary shape. Specifically, the contact areas may be three separated, non-overlapping areas possibly with different shapes. For example, a contact area may have a circular or rectangular shape of a well-defined size and position, or may even collapse to a single contact point which is defined e.g. by its position relative to the axis of symmetry. The relationship between the geometric properties of the three contact areas of the ESD device are defined with the help of the axis of symmetry. At this, it goes without saying that the axis of symmetry is a virtual, fictive axis and is not embodied as a physical entity within the ESD device.

As the first contact area and the third contact area are arranged on opposite sides with regard to the axis of symmetry, the first contact area and the third contact area are also arranged on opposite sides with regard to the second contact area. If now the first supply rail and the third supply rail are configured to provide a first supply voltage (denoted e.g. as power or VDD), the second supply rail is configured to provide a second supply voltage (denoted e.g. as ground or VSS) and the second supply rail is sandwiched between the first and the third supply rail, it becomes possible to physically rotate the ESD device e.g. by 180 degree with regard to the supply rails while still preserving the polarity of the first and the second supply voltage and without generating a short-cut.

Within the ESD device, the first contact area and the third contact area may be electrically connected with each other such that both contact areas have essentially the same electrical potential. In other words, both contact areas form a supply terminal for suppling the first supply voltage provided by both the first supply rail and the second supply rail. In between said supply terminal and the second contact area, a switching unit may be arranged. The switching unit may be implemented with any suitable device, such as, for example, an active clamp, a simple metal-oxide-semiconductor field effect transistor (MOSFET), an IGBT, a MOS-gated thyristor, or other suitable power device. The switching unit may have a gate to which a respective driving voltage or control signal may be applied to turn the switching unit on or off.

More specifically, the ESD device may comprise a switching unit configured to establish, in case the overvoltage or the overcurrent is detected at one or more I/O pads, an electrical connection between the supply terminal and the second contact area, and to isolate the supply terminal and the second contact area whenever no overvoltage or overcurrent is detected. Alternatively, the ESD device may comprise a switching unit configured to establish, in case the overvoltage or the overcurrent is detected at one or more I/O pads, an electrical connection between the first contact area and the second contact area, and to isolate the latter contact areas otherwise. Alternatively or additionally, the ESD device may comprise a switching unit configured to establish, in case the overvoltage or the overcurrent is detected at one or more I/O pads, an electrical connection between the third contact area and the second contact area, and to isolate the latter contact areas otherwise. By connecting the contact areas, the described switching units establish discharge paths for protecting electronic circuits which are located between the supply rails, too.

The first contact area, the second contact area and the third contact area may be configured such that an orientation of the ESD device with regard to the supply rails is adjustable from a first orientation to a second orientation. In the first orientation, the first contact area establishes an electrical contact with the first supply rail, the second contact area establishes an electrical contact with the second supply rail, and the third contact area establishes an electrical contact with the third supply rail. In the second orientation, the first contact area establishes an electrical contact with the third supply rail, the second contact area establishes an electrical contact with the second supply rail, and the third contact area establishes an electrical contact with the first supply rail. At this, the orientation of the ESD device may be adjustable from the first orientation to the second orientation by rotating the ESD device around an axis of rotation which is perpendicular to the axis of symmetry.

It should be mentioned that, both in the first and the second orientation of the ESD device, the ESD device preferably shows the same or at least a similar electrical behavior in terms of resistance and electro migration current densities.

The ESD device may further comprise a terminal for coupling the ESD device with an I/O pad. A directional conducting device (such as e.g. a diode) may be arranged on a path between the first contact area or the third contact area on the one hand and said terminal on the other hand. Alternatively, one may also say that the latter directional conducting device is coupled between the supply terminal (bridging the first contact area and the third contact area) and the second contact area. Moreover, the ESD device may further comprise another directional conducting device arranged on a path between the second contact area and said terminal for coupling the ESD device with the I/O pad.

The directional conducting device may be e.g. a diode. In this document, the directional conducting device is considered as an electronic component with at least two terminals that conducts primarily in one direction. That is, the diode has low resistance to the flow of current in a first direction, and high resistance in a second, opposite direction. An ideal diode would exhibit zero resistance in the first direction and infinite resistance in the second direction. As an example, a transistor operated as an active diode may as well serve as diode in the context of this document.

The directional conducting devices may prevent current flow through the directional conducting devices in times when no ESD strike occurs and establish a discharge path when an ESD strike happens. At this, a discharge current may flow e.g. from a first I/O pad through a directional conducting device of a first ESD device to a supply rail, and over a closed switching unit of the first ESD device to another supply rail, and through a directional conducting device of a second ESD device to a second I/O pad, thereby bypassing the electronic circuit. In addition, between the supply rails, the discharge current may flow over closed switching units of further ESD devices (such as e.g. the closed switching unit of the second ESD device).

The ESD device may be arranged above or beneath the three supply rails. It may be assumed that the three supply rails (a) run locally parallel, (b) have a certain width and (c) are arranged with a minimum distance between each other. Depending on the point of view, the three supply rails separate the space of the integrated circuit into two sub-spaces denoted as a first side and a second side. The described ESD device provides the advantage that an electrical connection for coupling the ESD device with an I/O pad may depart on both sides of the supply rails depending on the orientation of ESD device. On the one hand, if the ESD device is mounted in a first orientation on the supply rails, an electrical connection may reach a first I/O pad on the first side of the supply rails without crossing the supply rails. Said electrical connection begins at the terminal for coupling the ESD device with the I/O pad and ends at the first I/O pad. On the other hand, if the ESD device is in the second orientation, an electrical connection may reach a second I/O pad on the second side of the supply rails without crossing the supply rails. The electrical connection between the ESD device and the I/O pad may be implemented e.g. partly on an assembly redistribution layer RDL.

Put in a different way, the ESD device as well as a power supply network comprising a plurality of supply rails requires a minimum amount of symmetry such that the orientation of the ESD device may be turned with regard to the supply rails. To be more specific, a conventional dual power supply rail system needs to be split into at least three supply rails. If three supply rails are used, the polarity of the individual rails may be e.g. VSS-VDD-VSS or VDD-VSS-VDD. In general, the number of supply rails of the power supply network needs to be identical to the number contact areas within the ESD device. Furthermore, the polarity of the individual contact areas and the individual supply rails must match, both in the first orientation and in the second orientation.

It should be mentioned that, depending on the widths of the three supply rails, the first contact area and the third contact area may be located at different distances from the axis of symmetry. In particular, if the widths of the three supply rails are sufficiently large, said distances may be different as long as the contact areas are connectable with the respective supply rails, both in the first orientation and in the second orientation.

Nevertheless, a distance between the first contact area and the axis of symmetry may be equal to a distance between the third contact area and the axis of symmetry. At this, the distance may be e.g. determined between the centers (e.g. the geometric centers) or between the borders of the respective contact areas. For instance, the distance between the first contact area and the axis of symmetry may be equal to the distance between the first contact area and the second contact area. The other way round, the distance between the third contact area and the axis of symmetry may be equal to the distance between the third contact area and the second contact area.

The first contact area may be symmetrical to the third contact area with regard to the axis of symmetry. That is, the distances of both contact areas to the axis of symmetry may be identical. Further, the shapes of the contact areas may be mirrored with regard to the axis of symmetry. Alternatively or additionally, the first contact area and the third contact area may be point symmetrical with regard to a symmetry point. In other words, both position and shape of the first contact area may be the result of an inversion of the position and the shape of the third contact area through the symmetry point (also denoted as point reflection). The other way round, the geometry of the third contact area may be derived from the geometry of the first contact area by inversion through the symmetry point, too. Such a symmetry point may e.g. lie on the axis of symmetry or within the second contact area.

The three supply rails may extend along three straight, parallel lines which are parallel to the axis of symmetry of the ESD device. Specifically, the three supply rails may run in parallel only in a well-defined region of the integrated circuit. It should be noted that although the supply rails are not part of the claimed ESD device, the geometrical properties of the contact areas of the ESD device are implicitly defined by the geometrical properties of the supply rails.

The ESD device may comprise a fourth contact area for establishing an electrical contact with a fourth supply rail. In this scenario, the axis of symmetry does not pass through the second contact area, but is situated in between the second contact area and the fourth contact area. The first contact area and the third contact area are still arranged on opposite sides with regard to the axis of symmetry. In addition, the first contact area and the third contact area may be electrically coupled within the ESD device and the fourth contact area and the second contact area may be electrically coupled within the ESD device.

In case the ESD device comprises four contact areas as described above, the power supply network should preferably comprise four supply rails, too. The inner two supply rails may have a first polarity (e.g. power or ground) and the outer two supply rails may have a second polarity (e.g. ground or power).

A distance between the first contact area and the axis of symmetry may be equal to a distance between the third contact area and the axis of symmetry, and a distance between the second contact area and the axis of symmetry may be equal to a distance between the fourth contact area and the axis of symmetry. The first contact area may be symmetrical to the third contact area with regard to the axis of symmetry, and the second contact area may be symmetrical to the fourth contact area with regard to the axis of symmetry. In a special case, the second contact area, the third contact area and the fourth contact area may be arranged along an axis perpendicular to the axis of symmetry.

Moreover, the ESD device may comprise a fifth contact area for establishing an electrical contact with a fifth supply rail, wherein the axis of symmetry passes through the fifth contact area. An ESD device with five contact areas requires five supply rails. The polarity of the five supply rails may alternate in the direction of an axis perpendicular to the axis of symmetry, with two supply rails having a first polarity and three supply rails having a second polarity. Alternatively, the outer two supply rails may have a first polarity and the inner three supply rails may have a second polarity, or the outer four supply rails may have a first polarity and the inner supply rail may have a second polarity.

In general, whenever the ESD device comprises an even number of contact areas, the axis of symmetry runs in between the inner two contact areas, whereas, whenever the ESD device comprises an odd number of contact areas, the axis of symmetry runs through a contact area in the middle.

According to another aspect, a power supply network for supplying electric power to at least one electronic circuit within an integrated circuit is proposed. The power supply network comprises at least three supply rails, the three supply rails extending at least partly along three straight, parallel lines within a power supply plane. An inner supply rail is sandwiched between two outer supply rails. The two outer supply rails each provide a first supply voltage, wherein the first supply voltage is different from a second supply voltage provided by the inner supply rail. In the context of this document, the term "sandwiched" may refer to a situation in which the respective supply rails are e.g. immediately adjacent, and only separated by a minimum distance required by the used technology. In an exemplary scenario, the first supply voltage or the second supply voltage may be ground.

The power supply network may comprise a fourth supply rail, the fourth supply rail running parallel to the at least three supply rails. The inner supply rail and the fourth supply rail may be adjacent and sandwiched between the two outer supply rails. The fourth supply rail may provide the second supply voltage to the electronic circuit and/or the overall integrated circuit.

In other words, the power supply network may comprise at least four supply rails, wherein two adjacent inner supply rails are sandwiched between two outer supply rails, and the two outer supply rails each provide the first supply voltage. The first supply voltage may be different from the second supply voltage provided by each of the two adjacent inner supply rails.

According to yet another aspect, an electrostatic discharge ESD protection network is proposed. The ESD protection network comprises a power supply network as described above, a first ESD device as described above coupled to a first I/O pad via a first electrical connection, and a second ESD device as described above coupled to a second I/O pad via a second electrical connection. The first I/O pad and the second I/O pad are arranged on opposite sides with respect to the inner supply rail, and neither the first electrical connection nor the second electrical connection crosses the three supply rails. Further the ESP protection network may comprise an electronic circuit which is protected by the ESD devices, wherein the electronic circuit is electrically connected to the second supply rail and to at least one of the first supply rail and the third supply rail. Further, the electronic circuit may be coupled with both the first I/O pad and the second I/O pad for exchanging data signals.

The first ESD device and the second ESD device may be identically constructed, and the first ESD device may be rotated by 180 degree with regard to the second ESD device.

Moreover, the first and the third contact areas of the first ESD device may be connected with the outer supply rails and the second contact area of the first ESD device may connected with the inner supply rail. The first and the third contact areas of the second ESD device may be connected with the outer supply rails and the second contact area of the second ESD device may be connected with the inner supply rail. The first and the second ESD device may be either arranged above or beneath the power supply plane.

According to yet another aspect, a method for protecting an electronic circuit against an overvoltage or an overcurrent using an electrostatic discharge ESD device is proposed. The proposed method comprises the steps of establishing an electrical contact between a first contact area of the ESD device and a first supply rail, establishing an electrical contact between a second contact area of the ESD device and a second supply rail, and establishing an electrical contact between a third contact area of the ESD device and a third supply rail. An axis of symmetry passes through the second contact area, and the first contact area and the third contact area are arranged on opposite sides with regard to the axis of symmetry. Thus, the method comprises the step of arranging the first contact area and the third contact area on opposite sides with regard to the axis of symmetry. A distance between the first contact area and the axis of symmetry may be designed to be equal to a distance between the third contact area and the axis of symmetry.

According to yet another aspect, a method for supplying electric power, using a power supply network, to at least one electronic circuit within an integrated circuit is proposed. The power supply network comprises at least three supply rails. The method comprises arranging the three supply rails at least partly along three straight, parallel lines within a power supply plane. Next, the method comprises sandwiching an inner supply rail between two outer supply rails, wherein the two outer supply rails each provide a first supply voltage. The first supply voltage is chosen to be different from a second supply voltage provided by the inner supply rail.

According to yet another aspect, another method for supplying electric power, using a power supply network, to at least one electronic circuit within an integrated circuit is proposed. This time, the power supply network comprises at least four supply rails. The method comprises arranging the four supply rails at least partly along four straight, parallel lines within a power supply plane and sandwiching two adjacent inner supply rails between two outer supply rails. In doing so, the two outer supply rails each provide a first supply voltage, the first supply voltage being different from a second supply voltage provided by each of the two adjacent inner supply rails.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
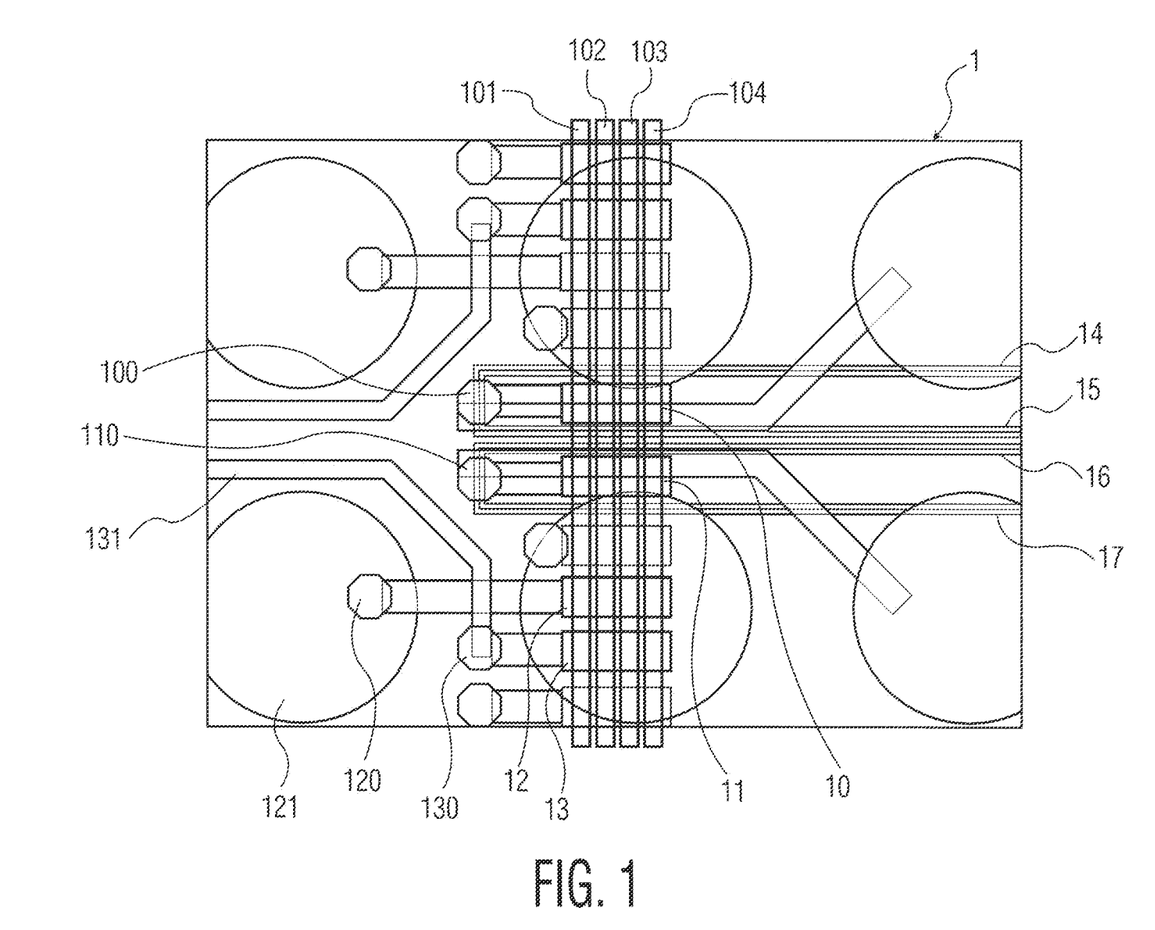
FIG. 1 shows a layout of an integrated circuit with ESD devices.

As outlined above, the present document relates to electrostatic discharge ESD devices and corresponding power supply networks for protecting internal circuit devices (electronic circuits) of an integrated circuit against overvoltages and/or overcurrents. FIG. 1 shows a layout of an integrated circuit 1 with ESD devices 10, 11, 12, 13 known from the state of the art. FIG. 1 shows ten ESD devices in total, wherein the ESD devices are arranged above or below power supply rails 101, 102, 103, 104. The power supply rails belong to a power supply network, and the two left power supply rails 101, 102 supply the integrated circuit with a first supply voltage (e.g. power, VDD, or VCC) and the two right power supply rails 103, 104 supply the integrated circuit with a second supply voltage (e.g. ground or VSS). An internal circuit device which is powered by the supply rails 101, 102, 103, 104 is not depicted in FIG. 1.

The ESD devices comprise four contact areas (not shown) for establishing electrical contacts with the respective supply rails 101, 102, 103, 104. For this purpose, two contact areas for connecting with the left supply rails 101, 102 are arranged in the left halves of the ESD devices, and two contact areas for connecting with the right supply rails 103, 104 are arranged in the right halves of the ESD devices.

Electrical connections leave the ESD devices and connect each ESD device with a pad 100, 110, 120, 130 (also denoted as I/O pad or pad opening), which in turn connects the ESD devices with balls 121, either directly or via further routing on an assembly redistribution layer RDL. From the upper four ESD devices and the lower four ESD devices, the electrical connections extend to the left of the supply rails 101, 102, 103, 104. For example, a first electrical connection departing from ESD device 12 reaches a ball 121 via pad opening 120. The pad opening 120 may be e.g. a hole in a passivation layer which protects the chip against touching. The pad opening 120 may connect the RDL with an aluminum layer in which the supply rails 101, 102, 103, 104 are implemented. As another example, a second electrical connection departing from ESD device 13 reaches a second I/O pad 130. Departing from I/O pad 130, RDL wiring 131 of the RDL layer connects ESD device 13 with another ball (not shown) located further away from the supply rails 101, 102, 103, 104.

As can be seen in FIG. 1, all pad openings have to be positioned on the left side of the supply rails 101, 102, 103, 104 due to the polarity of the supply rails. If a ball on the right side of the supply rails needs to be connected with a pad opening on the left side, the intersecting connections 14, 15, 16, 17 which cross the supply rails need to be designed. Intersecting connections 14, 15, 16, 17 may be placed in a layer above or below the supply rails. In the illustrated example, intersecting connections 14, 15, 16, 17 couple ESD devices 10 and 11 via pad openings 100 and 110 with the two balls on the right side of the supply rails 101, 102, 103, 104. As a disadvantage, additional space is required which separates ESD devices 10 and 11 from the remaining ESD devices and is used for intersecting connections 14, 15, 16, 17. As a further disadvantage, the lengths of the electrical connections extending to the ride side increases, resulting in an unwanted higher resistance of the respective discharge paths. As yet another disadvantage of the illustrated example from the prior art, the routing of the electrical connections, in particular the routing of the electrical connections on the RDL layer is complicated due to the uniform, parallel orientation of the ESD devices.

Obviously, with the layout of the ESD devices and supply rails 101, 102, 103, 104 depicted in FIG. 1, it is not possible to turn an ESD device by 180 degree to facilitate routing to balls located on the right side of the supply rails, since such a rotation would inevitably lead to a short-cut of the power supply system.

Figure 2:
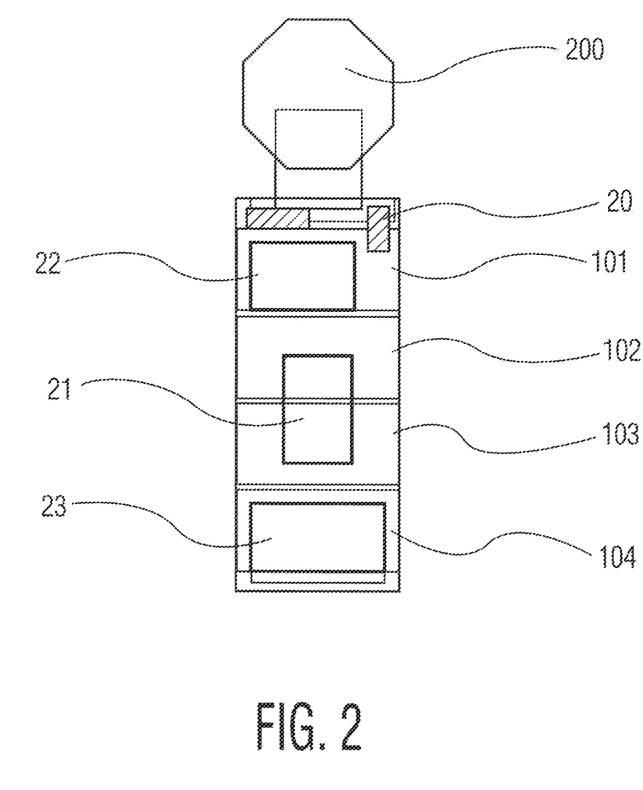
FIG. 2 shows a layout of an ESD device and power supply rails.

FIG. 2 provides an enlarged view on a single ESD device 20 which is connected with a pad opening 200. ESD device 20 may be e.g. one of the ten ESD devices depicted in FIG. 1. The exemplary ESD device 20 comprises an active clamp cell 21 which acts as a switching unit for connecting supply rails with each other in the event of an ESD strike. More precisely, the latter switching unit is configured to connect/disconnect supply rails 101, 102 supplying the integrated circuit with the first supply voltage with/from supply rails 103, 104 supplying the integrated circuit with the second supply voltage. Moreover, the ESD device 20 comprises a first diode 22 and a second diode 23. The first diode 22 is arranged on a discharge path between supply rails 101 and 102 and pad opening 200. The second diode 23 is arranged on a discharge path between supply rails 103 and 104 and pad opening 200. Alternatively, the two diodes 22, 23 may be positioned externally e.g. at the pad opening 200 or at the supply rails 101, 102, 103, 104 and, thus, may not be part of the ESD device 20 itself. It is the duty of the diodes 22, 23 to prevent current flow through the ESD device 20 in times when no ESD strike occurs and to establish a discharge path through the ESD device when an ESD strike happens.

Figure 3:
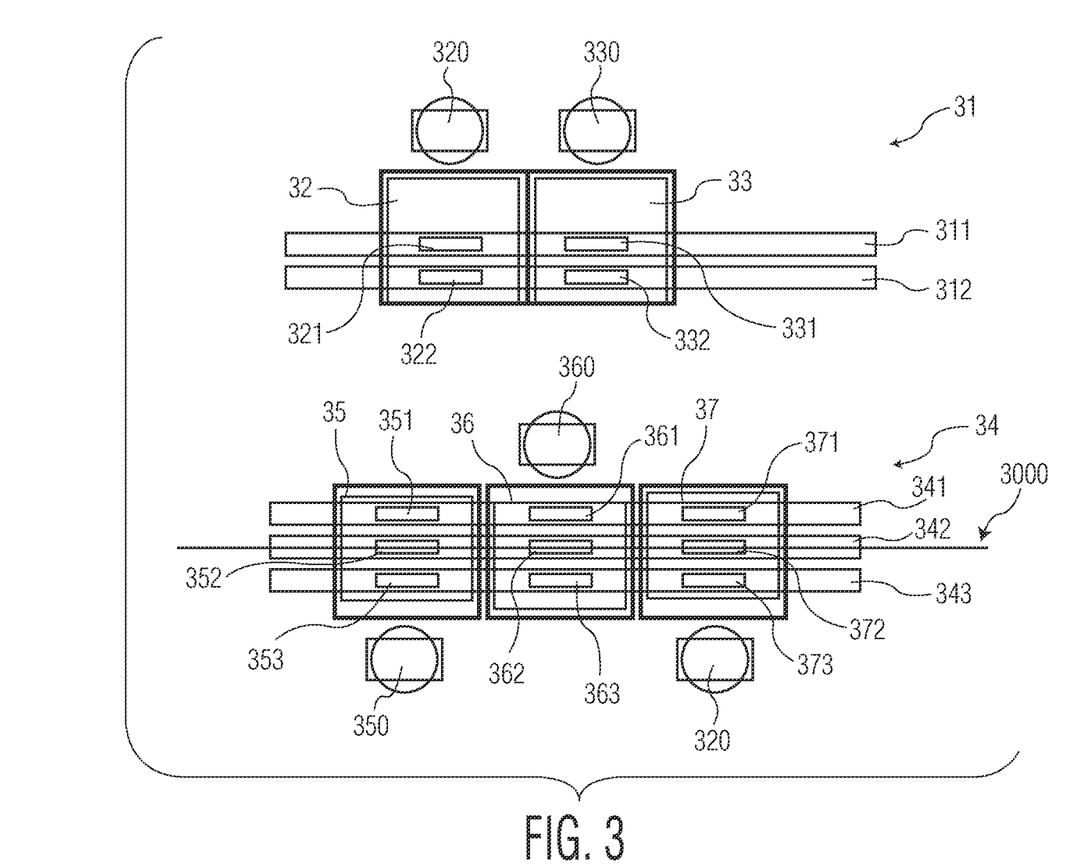
FIG. 3 shows a schematic illustration of ESD devices and corresponding power supply rails.

The top schematic of FIG. 3 displays a conventional ESD protection network 31 with two supply rails 311 and 312. As already described in the foregoing, conventional ESD devices 32, 33 may only comprise two contact areas 321, 322 and 331, 332 which do not allow rotation of the ESD devices 32, 33 with regard to the supply rails 311 and 312. Consequently, pad openings 320, 330 may only be reached on one side (here the upper side) of the supply rails without crossing the supply rails.

The bottom schematic of FIG. 3 displays an exemplary ESD protection network 34 as proposed in the present document. The illustrated example for an ESD protection network 34 comprises three ESD devices 35, 36, 37 which are designed symmetrically in a sense that the inner contact areas 352, 362, 372 are located in between two outer contact areas 351, 353, 361, 363, 371, 373. An exemplary axis of symmetry 3000 passes through the inner contact areas 352, 362, 372. As the two supply rails 311, 312 are now split up into three supply rails 341, 342, 343, wherein the inner supply rail 342 has a different polarity than the outer supply rails 341, 343, it becomes possible to flip ESD devices with regard to the supply rails and reach pad openings 350, 360, 370 on different sides (i.e. the upper and the lower side) of the supply rails without crossing the supply rails. In the displayed example arrangement, pad opening 360 is located above the supply rails and pad openings 350 and 370 are located below the supply rails.

Figure 4:
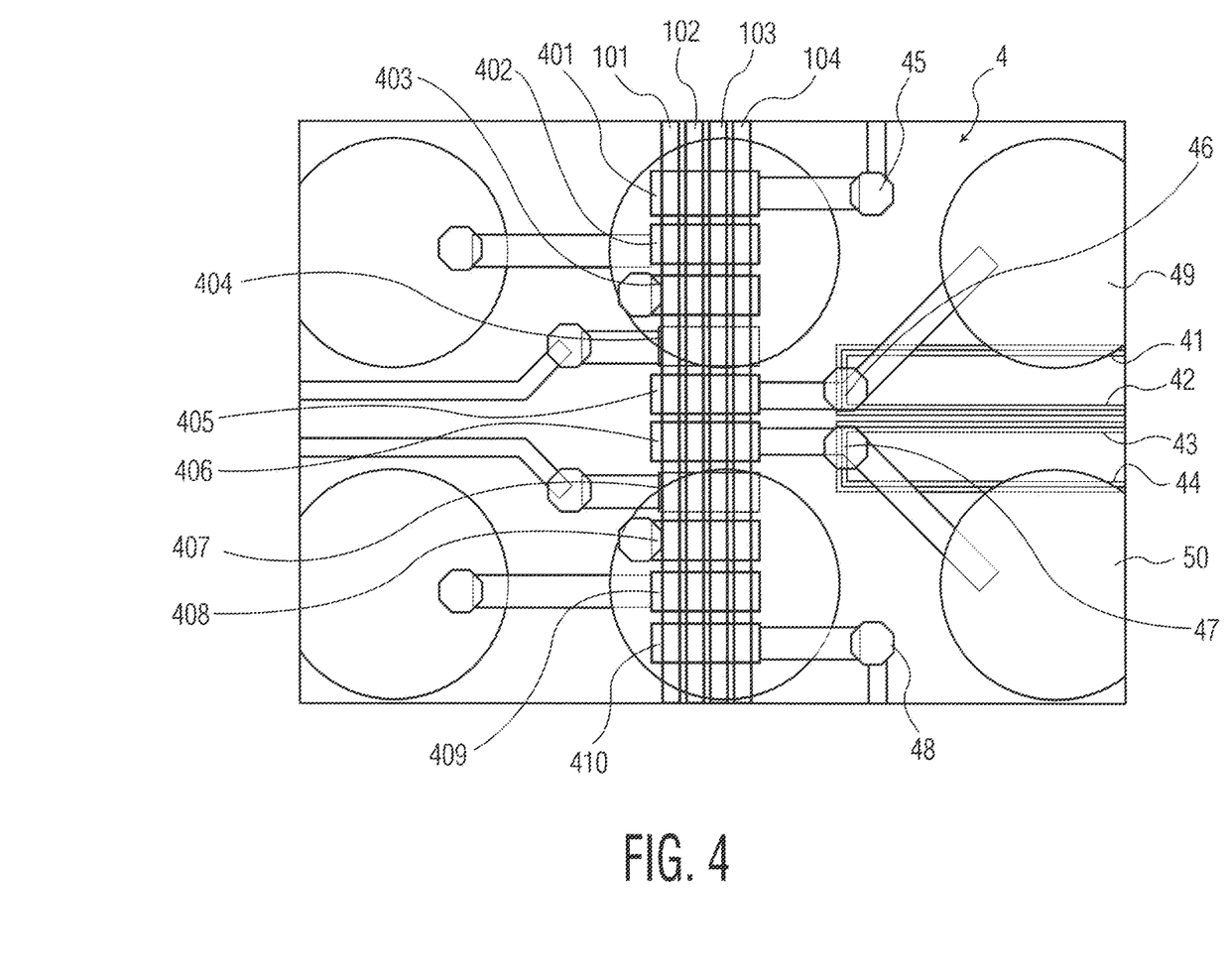
FIG. 4 shows an exemplary layout of an integrated circuit with exemplary ESD devices.

FIG. 4 shows a layout of an integrated circuit 4 with exemplary ESD devices 401 to 410 in accordance with the principles presented in this document. This time, the inner supply rails 102, 103 have a first polarity, and the outer supply rails 101, 104 have a second polarity. In addition, the arrangement of contact areas within the ESD devices allow flipping the ESD devices by 180 degree without generating a short-cut. In comparison to the integrated circuit 1 illustrated in FIG. 1, only six ESD devices 402, 403, 404, 407, 408, 409 are oriented towards the left side of the supply rails. The remaining four ESD devices 401, 405, 406, 410 are oriented to the right side to connect the ESD devices 401, 405, 406, 410 with balls on the right side. The latter balls may be reached either via pad openings 45, 48, or via pad openings 46, 47. Starting from pad openings 46, 47, the balls 49, 50 may be reached using wiring 41, 42, 43, 44 of the RDL layer.

In FIG. 4, each ESD device may comprise an active clamp for connecting supply rails with opposite polarities with each other in the event of an ESD strike. That is, an active clamp may be configured to short-cut supply rails 101, 104 with supply rails 102, 103 in the event of an ESD strike, and to isolate the latter supply rails from each other during regular operation of the integrated circuit. Similarly, each ESD device may comprise a first directional conductor (e.g. a diode) coupling the respective pad with supply rails 101, 104. On the other hand, each ESD device may comprise a second directional conductor coupling the respective pad with supply rails 102, 103.

In comparison to the layout of FIG. 1 which is known from the prior art, the example layout in FIG. 4 enables improved RDL routing flexibility, shorter overall discharge paths and hence discharge paths with lower resistance. Moreover, die size area is saved due to the smaller pitch between the ESD devices. Specifically, the intersecting connections 14, 15, 16, 17 of FIG. 1 become dispensable and are replaced by wiring 41, 42, 43, 44. The four ESD devices 404, 405, 406, and 407 in the middle may be arranged closer together. This reduction of the area required by the ESD devices becomes possible by using ESD devices of the same type and simply rotating the ESD devices with regard to the supply rails.

Figure 5:
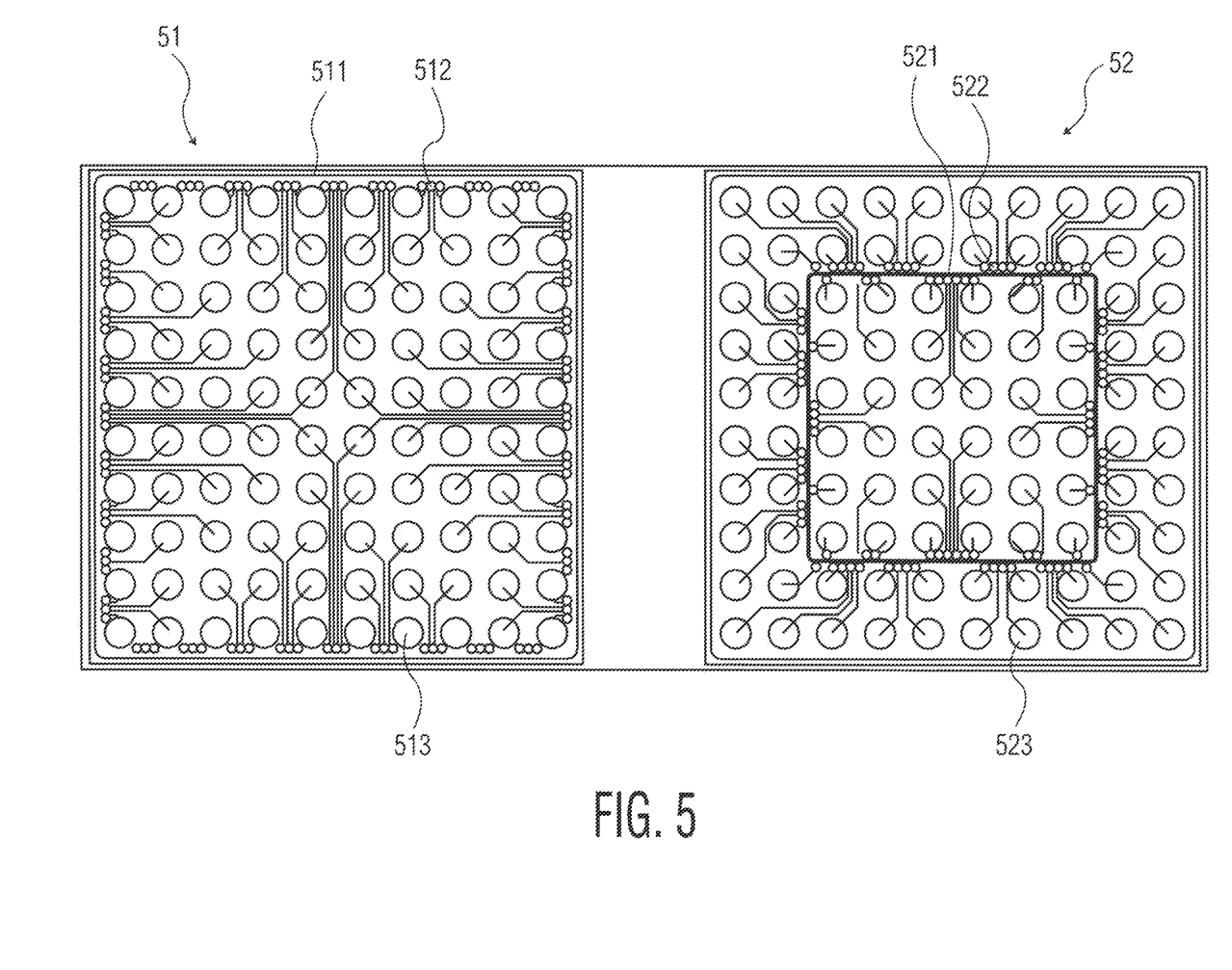
FIG. 5 shows other exemplary layouts of an integrated circuit with exemplary ESD devices.

In order to optimize usage of the available area of the integrated circuit and in order to minimize the resistances of the discharge paths, it may be beneficial to place ESD devices and corresponding supply rails into the core area of the integrated circuit. FIG. 5 shows two possible designs for arranging the supply rails and ESD devices. The left design 51 shows 100 balls 513 connected with ESD devices which are arranged along supply rails 511 at the borders of the integrated circuit. Design 51 is known from the prior art and pad openings 512 to which the ESD devices are connected are all located on the same side of the supply rails 511. That is, two supply rails 511 are sufficient, wherein one supply rail provides e.g. power VDD and the other supply rail provides ground VSS to the integrated circuit.

On the other hand, the right design 52 is an example based on the ideas presented in this document. At least 3 supply rails with alternating polarity are arranged along a rectangle which separates the center of the integrated circuit from a border region. In the border region, 64 balls 523 are connected through pad openings 522 with ESD devices being arranged on the supply rails in a first orientation. In the center region, 36 balls 523 are connected through pad openings 522 with ESD devices being arranged on the supply rails in a second orientation which is reversed with regard to the first orientation. As a result, the area occupied by the ESD protection network comprising ESD devices and supply rails is reduced by approximately 40% compared to the left design 51. On average, the resistance of the discharge paths is reduced. Further, the maximum resistance (which is e.g. important for point-to-point ESD strike tests) among all discharge paths is reduced.

Figure 6:
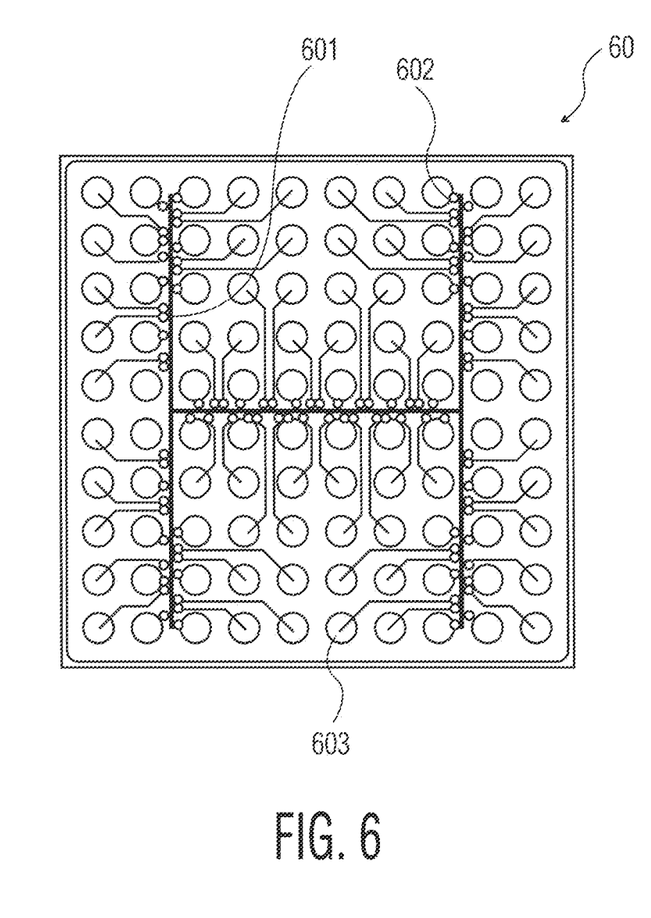
FIG. 6 shows yet other exemplary layouts of an integrated circuit with exemplary ESD devices.

Similarly, FIG. 6 shows another example design 60 based on the ideas presented in this document. Again, supply rails and mounted ESD devices are placed in the core area of the integrated circuit. In design 60, a bundle of at least 3 supply rails 601 with alternating polarity is placed within the integrated circuit in an H-shaped manner. Again, ESD devices may be placed on the supply rails 601 in one of two possible orientations to reach pad openings 602 on both sides of the supply rails 601 without having to cross the supply rails 601. The area occupied by the ESD protection network comprising ESD devices and supply rails is reduced by approximately 40% compared to a design 51 known from the prior art.

In both designs 52 and 60, a designer may freely select the orientation of the individual ESD devices with regard to the supply rails to optimize the resistances (i.e. the lengths) of the discharge paths i.e. to optimize routing of the electrical connections from the ESD devices to the respective balls. This increased flexibility may be in particular beneficial for large integrated circuits where placing ESD devices on supply rails at the border (e.g. in the region of the sealrings) comes to its limits.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An electrostatic discharge ESD protection network with a power supply network for supplying electric power to at least one electronic circuit, the power supply network comprising at least three supply rails, the three supply rails extending at least partly along three straight, parallel lines within a power supply plane, wherein an inner supply rail is sandwiched between two outer supply rails, and the two outer supply rails each provide a first supply voltage, the first supply voltage being different from a second supply voltage provided by the inner supply rail, a first ESD device coupled to a first I/O pad via a first electrical connection,
   a second ESD device coupled to a second I/O pad via a second electrical connection, and
   an electronic circuit to be protected by the ESD devices against an overvoltage or an overcurrent, the electronic circuit being electrically connected to the second supply rail and to at least one of the first supply rail and the third supply rail,
   wherein
   the first I/O pad and the second I/O pad are arranged on opposite sides with respect to the inner supply rail, and neither the first electrical connection nor the second electrical connection crosses the three supply rails.

2. The ESD protection network according to claim 1, wherein the electronic circuit is coupled with both the first I/O pad and the second I/O pad.

3. The ESD protection network according to claim 1, wherein the first ESD device and the second ESD device are identically constructed, and the first ESD device is rotated by 180 degree with regard to the second ESD device.

4. The ESD protection network according to claim 1, wherein each of the first ESD device and the second ESD device comprises
   a first contact area configured to establish an electrical contact with the first supply rail,
   a second contact area configured to establish an electrical contact with the second supply rail, and
   a third contact area configured to establish an electrical contact with the third supply rail, and
   wherein
   an axis of symmetry passes through the second contact area, and
   the first contact area and the third contact area are arranged on opposite sides with regard to the axis of symmetry.

5. The ESD protection network according to claim 1, wherein the first and the third contact areas of the first ESD device are connected with the outer supply rails, the second contact area of the first ESD device is connected with the inner supply rail, and the first and the third contact areas of the second ESD device are connected with the outer supply rails, the second contact area of the second ESD device is connected with the inner supply rail.

6. The ESD protection network according to claim 1, wherein both the first and the second ESD device are either arranged above or beneath the power supply plane.

7. The ESD protection network according to claim 1, wherein the power supply network comprises a fourth supply rail, the fourth supply rail running parallel to the at least three supply rails, wherein the inner supply rail and the fourth supply rail are adjacent and sandwiched between the two outer supply rails and the fourth supply rail provides the second supply voltage to the at least one electronic circuit.

8. The ESD protection network according to claim 7, wherein the first supply voltage or the second supply voltage is ground.

9. The ESD protection network according to claim 1, wherein the first supply voltage or the second supply voltage is ground.

* * * * *